(12) United States Patent
Petasch et al.

(10) Patent No.: US 7,295,331 B2
(45) Date of Patent: Nov. 13, 2007

(54) OPTICAL ELEMENT WITH AN OPTICAL AXIS

(75) Inventors: Thomas Petasch, Aalen (DE); Hartmut Muenker, Aalen (DE); Bernhard Gellrich, Aalen (DE)

(73) Assignee: Carl Zeiss Smt Ag, Oberkochen (DE)

(*) Notice: Subject to any disclaimer, the term of this patent is extended or adjusted under 35 U.S.C. 154(b) by 0 days.

(21) Appl. No.: 10/489,030

(22) PCT Filed: Oct. 18, 2002

(86) PCT No.: PCT/EP02/11656

§ 371 (c)(1),
(2), (4) Date: Apr. 15, 2004

(87) PCT Pub. No.: WO03/036359

PCT Pub. Date: May 1, 2003

(65) Prior Publication Data

US 2004/0257683 A1 Dec. 23, 2004

(30) Foreign Application Priority Data

Oct. 20, 2001 (DE) .............................. 101 51 919

(51) Int. Cl.
*G02B 5/08* (2006.01)

(52) U.S. Cl. .................................................. 356/846

(58) Field of Classification Search ................ 359/846, 359/847, 848, 849

See application file for complete search history.

(56) References Cited

U.S. PATENT DOCUMENTS

| | | | | | |
|---|---|---|---|---|---|
| 1,910,119 | A | * | 5/1933 | De Witt | 359/847 |
| 4,046,462 | A | * | 9/1977 | Fletcher et al. | 359/847 |
| 4,066,343 | A | * | 1/1978 | Scott | 359/849 |
| 4,143,946 | A | * | 3/1979 | Leo et al. | 359/845 |
| 4,196,972 | A | * | 4/1980 | Rawlings | 359/849 |
| 4,226,507 | A | * | 10/1980 | Fuschetto | 359/849 |
| 4,647,164 | A | * | 3/1987 | Sawicki et al. | 359/849 |
| 5,365,379 | A | * | 11/1994 | Sawicki | 359/846 |
| 5,680,262 | A | * | 10/1997 | Soliday et al. | 359/840 |

FOREIGN PATENT DOCUMENTS

| | | |
|---|---|---|
| DE | 198 25 716 | 12/1999 |
| DE | 198 27 603 | 12/1999 |
| DE | 198 59 634 | 6/2000 |
| EP | 0 938 009 | 8/1999 |
| JP | 2000-114143 | 4/2000 |

* cited by examiner

*Primary Examiner*—Mark A. Robinson
(74) *Attorney, Agent, or Firm*—Welsh & Katz, Ltd.

(57) ABSTRACT

The invention concerns an optical element (1) with an optical axis (3), designed in particular for an exposure lens used in semiconductor lithography. Said optical element comprises at least an extension (2, 2') in the direction of the optical axis (3). A device (11) enables to induce a two-wave or multiple wave deformation in said optical element (1). At least a system (12) mounted in the extension zone (2, 2') is designed to apply a force in said extension (2, 2').

27 Claims, 6 Drawing Sheets

OPTICAL ELEMENT WITH AN OPTICAL AXIS

The invention relates to an optical element with an optical axis, and to an apparatus for instituting a two-wave or multi-wave deformation in this optical element.

The invention relates in particular to an optical element that is designed as a mirror in its preferred embodiment for the purpose of use in an exposure lens for semiconductor lithography.

DE 198 27 603 A1 discloses an optical system that includes a so-called "active optical element". Actuators acting on the optical element at least approximately perpendicular to the optical axis can influence this active optical element by means of forces in such a way that deformations are produced by forces, which are non-rotationally symmetrical and deviate from being radial, and/or torques on the optical element. Such a system can institute deformations in the optical element that can serve the purpose, for example, of compensating an astigmatism or the like.

Furthermore, the prior art is aware from DE 198 12 021 A1 of active mirrors that are equipped with a silvered membrane. The surface shape of the membrane is influenced via one or more actuators with the result that the mirror surface is manipulated, and thus it is possible to influence the image produced by the mirror.

Comparable designs that likewise achieve a corresponding influence on the optical imaging quality via a deformation of a surface of a mirror are described, for example, in WO 93/25929 or U.S. Pat. No. 5,210,653.

Moreover, DE 196 28 672 A1 discloses an adaptive mirror that has a deformable mirror plate held at the rim. This mirror plate is acted upon at the rear by an actuating mechanism that permits a deformation of the mirror plate. It is possible here to achieve an appropriate adaptation of the mirror plate, although the possibilities of the deformations that can be instituted are relatively restricted.

In addition to the requirement of deforming an optical element, for example a mirror, in the above-named manner, there is a requirement for very high accuracy of the possible deformations in the field of high precision optics as it is used, for example, in semiconductor lithography systems.

The optical elements that are to be deformed must therefore react exclusively to the deformation. Undesired side effects and undesired deformations are intended not to occur, if possible. In the case of the deformation predominantly required, specifically the correction of instances of astigmatism, or multiwave errors, for example three-wave or four-wave ones, such a targeted deformation is very difficult because, apart from being deformed, the optical element can react by changing its surface shape and/or thickness in the multiwave region.

Moreover, the above-named designs mostly require a very large space, and this is disadvantageous in the case, in particular, of use in imaging systems that permit a very dense packaging, or the like.

It is therefore the object of the invention to create an optical element that avoids the above-named disadvantages of the prior art, and is very well suited to the institution of two-wave or multiwave deformations.

It is also an object of the invention to create an apparatus for instituting two-wave or multiwave deformations in such an optical element.

This object is achieved according to the invention in that the optical element has at least one extension in the direction of the optical axis.

It is possible via the at least one extension to introduce forces into the optical element in order to deform the latter appropriately. This deformation can be appropriate and/or desired in order to balance aberrations or to minimize the effect of the latter.

In this case, the extension is to be understood as either a discrete component or a projection provided on the optical element that projects over the actual surface of the optical element in the direction parallel to the optical axis. The extension can in this case have any desired shape, for example the shape of a rod or the like.

It is possible in this case in a very advantageous way to arrange points of action, serving for the introduction of forces, in the at least one extension at various sites depending on the design of the extension, for example in two diametrically opposite regions. The two points of action serve to introduce an appropriate force that can thus be introduced into the optical element in a very targeted and precise fashion via the extensions as levers the same. Of course, it is also conceivable in principle to introduce a torque, a torque being introduced into the optical element in any case given the appropriate application of the forces on the extension or the extensions.

In a particularly favorable embodiment of the invention, the extension is designed as an at least approximately tubular unipartite extension of the optical element.

This tubular extension results in a type of mirror pot or lens pot. A very uniform response of the optical element itself to the forces or torques introduced can be achieved by introducing the forces into the region of the tubular extension of thee optical element, for example a mirror, a lens, an end plate or the like. Specifically, the forces or stresses introduced are passed on very uniformly to the optical element itself by the rotary tubular extension. Consequently, it is thus possible to introduce a torque with the aid of very few discrete forces on one side, averted from the optical element, of the tubular extension, doing so as a function of diameter, length and wall thickness of the tubular extension. Because of the tubular extension, this torque will effect a continuous torque on the other side, thus the one facing the optical element, of the tubular extension.

Thus, the design of the invention in accordance with the exemplary embodiment illustrated here permits a continuous torque profile to be generated with the aid of a few discrete forces in a particularly advantageous way via the tubular extension.

There is also the possibility that, when use is made of an appropriate mechanism for introducing the force, the latter can be applied independently of the angle since the extension is designed after all in the manner of a tube that rotates. Contrary to the individual extensions already mentioned above, for example two or four depending on the desired wariness of the deformations to be instituted, the result here is thus the possibility that the desired deformations can be adapted in each case to the optical element with regard to their waviness and their angular position without the need for a corresponding optical element specifically designed for the purpose of use.

This design offers enormous advantages in the case of a mirror, in particular, since all the elements for instituting deformations or the like can be accommodated in this "pot", thus resulting in a very compact design that has integrated its mechanics and/or its actuators.

A solution according to the invention for an apparatus for instituting a two-wave or multiwave deformation in such an optical element is described in claim 9.

By being introduced into the extension, the forces can be passed on via the geometrical design of the extension in a very targeted fashion to the surface used for the optical imaging, or to the region of the optical element that is used.

In this case, it is possible given the design as a mirror, in particular, for the surface of the mirror that is used to be designed with the same stiffness such that, in accordance with the principle of the plate of equal thickness, no higher-wave aberrations are introduced in the deformation. Moreover, the possibility arises that, given an appropriate rotationally symmetrical design of the tubular extension, the institution of the two-wave or multiwave deformations, for example of an astigmatism on each axis, can occur perpendicularly to the optical axis, and thus that the axis of the instituted deformation can be freely selected, as already mentioned above.

Further advantageous refinements of the invention follow from the remaining subclaims and from the exemplary embodiments illustrated below with the aid of the drawings, in which:

Figures 1, 2, 3A, 3B:
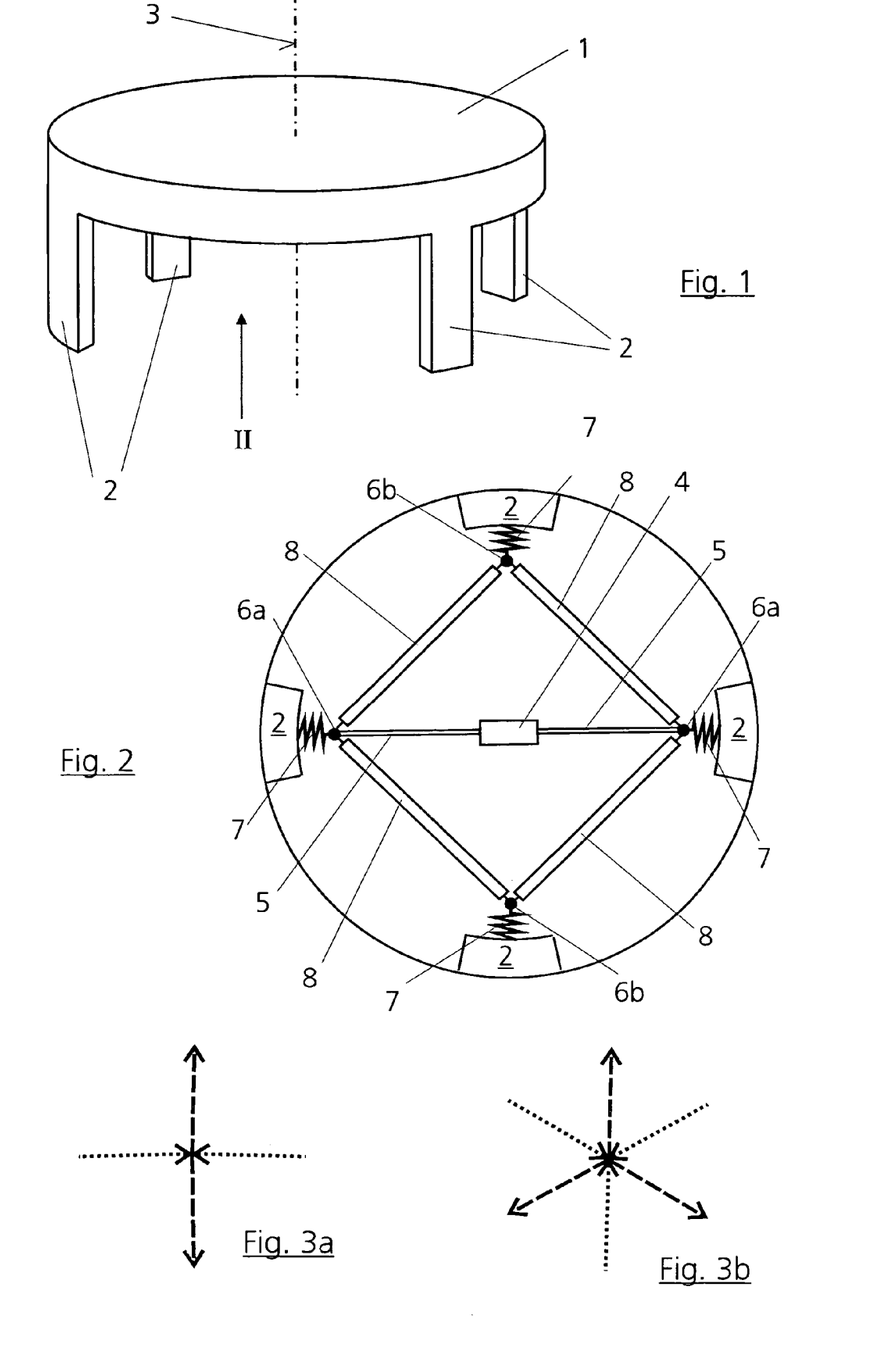
FIG. 1 shows an illustration of the principle of an embodiment of the optical element.
FIG. 2 shows a view in accordance with the arrow II in FIG. 1, with a possible embodiment of an actuator.
FIG. 3a shows an illustration of the principle of the equilibrium of forces in the case of a two-wave deformation (astigmatism)
FIG. 3b shows an illustration of the principle of the equilibrium of forces in the case of a three-wave deformation (astigmatism)

FIG. 1 shows a highly schematic illustration of an optical element 1 that has been sketched here merely as a plane-parallel plate in order to simplify the illustration. Located on the optical element 1 are four extensions 2 that run in a fashion starting from the optical element 1 and parallel to its optical axis 3.

In a particularly advantageous way, the optical element 1 is designed in one piece with its extensions 2, such that forces acting on the extensions 2 are passed in an ideal fashion by the latter onto the optical element 1 such that a deformation of the optical element can be targeted. Basically, two of the extensions 2 already suffice to achieve simple deformations of the optical element. The number of four extensions 2 illustrated here is particularly appropriate for instituting an astigmatism.

FIG. 2 shows a view in accordance with the arrow II in FIG. 1, with a possible embodiment of an actuator 4 that is intended here to serve, in particular, for instituting a two-wave deformation, that is to say an astigmatism. The sole actuator 4 is connected in this case via two transmission elements 5 to in each case two hinge points 6a that are coupled to two of the extensions 2 via spring elements 7. Jointed rods 8 run from the two hinge points 6a to two further hinge points 6b that are likewise connected to the two other extensions 2 via spring elements 7.

This design permits the desired introduction of force into the extensions 2 to be performed with the aid of the single actuator 4 by an expansion or contraction of the actuator 4, and thus a corresponding movement of the transmission elements 5.

If the actuator 4 in the illustration in accordance with FIG. 2 has its length shortened, said actuator or the transmission elements 5 will pull on the two hinge points 6a. There will thus be introduced into the two extensions 2, which are connected to the two hinge points 6a by means of the spring elements 7, a force whose direction is directed in the direction of the optical axis 3. At the same time, the two hinge points 6b are pressed away from one another via the jointed rods 8 such that there is introduced into the region of the extensions 2 interacting with the hinge points 6b via the spring elements 7 a force that runs from the optical axis 3 in the direction of the extensions 2.

These forces are illustrated in principle once again in FIG. 3a in accordance with the description just given. It is clearly to be seen that an equilibrium of forces prevails overall at the optical element 1, such that the latter does not move from its position which is to be kept very exactly, particularly for the preferred purpose of use in the field of lithography lenses.

FIG. 3b exemplifies this result of the equilibrium of forces for a further application, here the institution of a three-wave deformation. Of course, such a three-wave deformation would require the presence of six of the extensions 2 if the optical element 1 is to be designed in accordance with the previously described exemplary embodiment, since two action points are required per waviness of the deformation.

Of course, the actuator 4 in accordance with FIG. 2 can also be moved in the other direction such that the two hinge points 6a are pressed apart from one another. Consequently, the hinge points 6b are moved toward the optical axis 3, and so the mode of operation described above is reversed.

It should be clear in this case that a design as described with reference to FIG. 2 comes into consideration only for an optical element 1 that is designed as a mirror, since otherwise the actuator 4, the transmission elements 5 and, if appropriate, also the jointed rods 8 would project into the image field of the optical element 1.

When use is made of actuators 4 of different design, it is, however, entirely possible for a corresponding optical element 1 also to be designed as a lens, as a plane-parallel plate or the like, which could then be comparable with regard to the deformation to be instituted via appropriate actuators 4.

Figure 4:
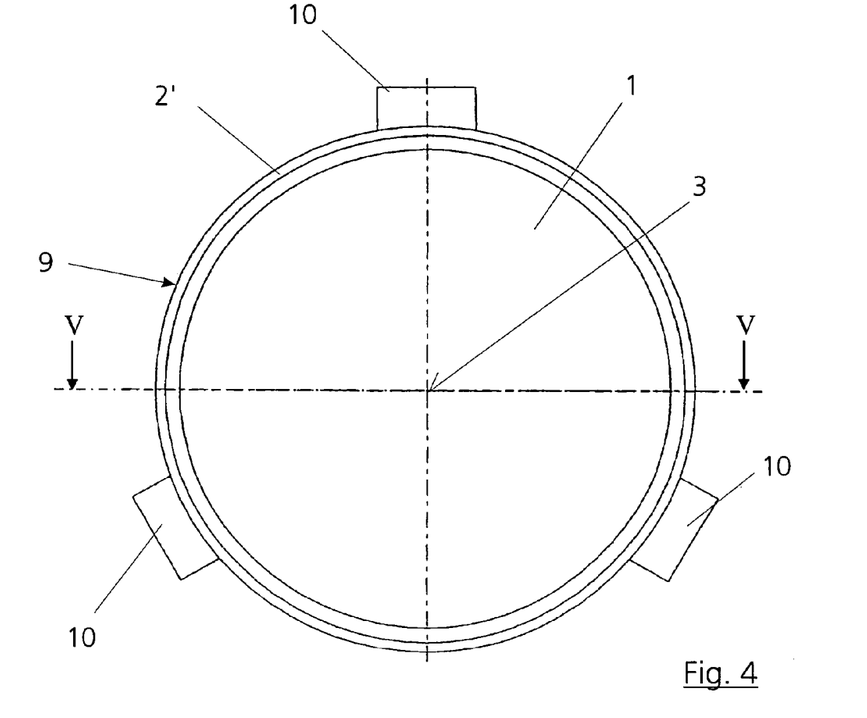
FIG. 4 shows an alternative embodiment of the optical element.
Figure 5:
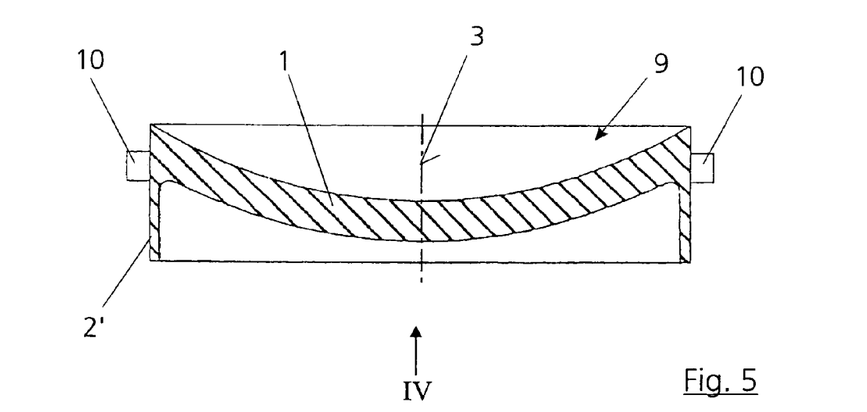
FIG. 5 shows a section through the optical element in accordance with the line V-V in FIG. 4.

FIG. 4 shows an embodiment of the optical element 1 as a mirror that is adjoined by an extension 2' of tubular design, as is clearly to be seen particularly in the sectional illustration in accordance with FIG. 5. The optical element 1 thus forms a type of mirror pot 9 with its tubular extension 2' designed in one piece with it. Said pot has holding elements 10, which are of no further relevance for the present invention and are also not described in more detail below.

The tubular extension 2' of the mirror pot 9 can, on the one hand, be of cylindrical design, and this can be appropriate particularly with regard to the forces to be introduced, and to the connection between the optical element 1 and the tubular extension 2' in its unipartite design.

In addition to this cylindrical design, it is also possible to conceive a frustoconical design (not illustrated here) of the tubular extension 2'. This can be appropriate, in particular, for use in the case of transparent optical elements 1, since a frustoconical, tubular extension 2' that opens on the side averted from the optical element 1 provides the possibility of arranging actuators 4 outside the region of the optical element 1 of interest for transmission.

On the other hand, in the case of the use of a mirror, it is possible, for example, for a frustoconical tubular extension 2' tapering in the direction of the side averted from the optical element 1 to be appropriate, since here the forces introduced into the optical element 1 can be varied, and a certain saving in space would be conceivable by contrast with the cylindrical tubular extension 2' illustrated here.

It is, of course, to be noted in principle that force components in the direction of the optical axis could arise from the frustoconical design of the tubular extension 2'. Although this permits a wider range of variation in the use of the required forces, it is, however, also necessary to pay heed here to the equilibrium of forces so that the optical element is not moved from its prescribed desired position.

Figure 6:
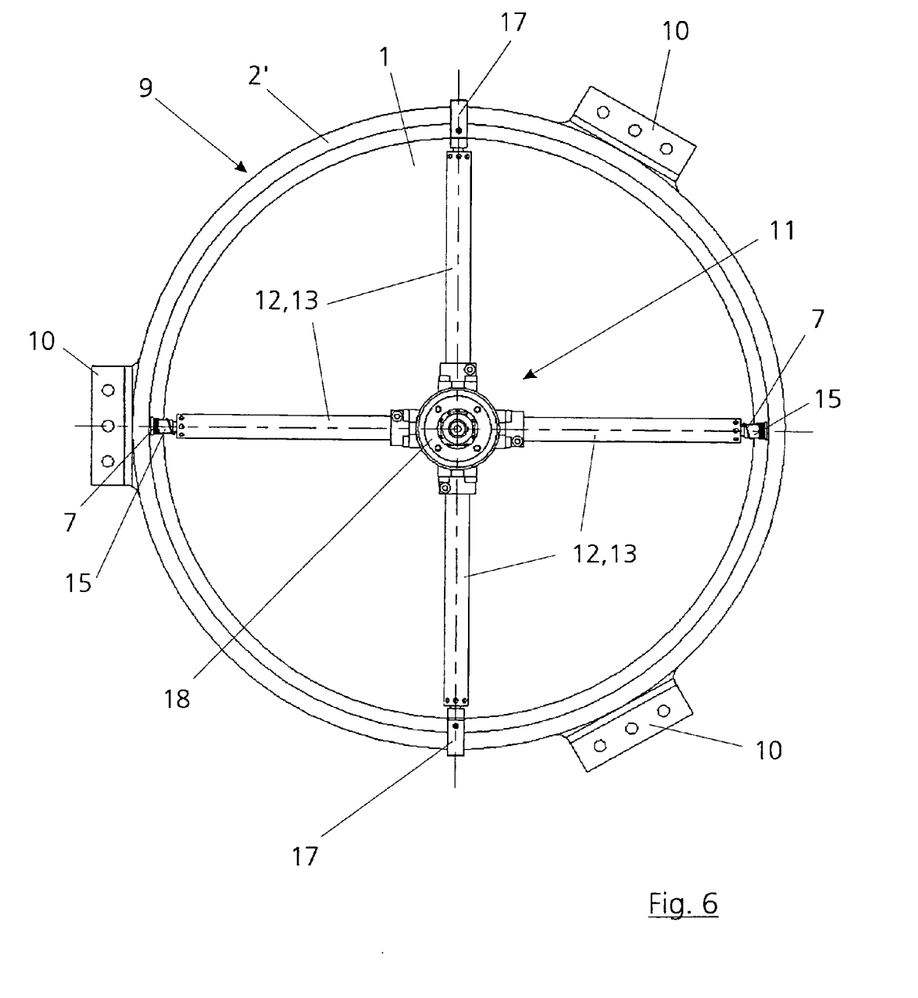
FIG. 6 shows the optical element in accordance with FIG. 4, with an apparatus for instituting a two-wave deformation.
Figure 7:
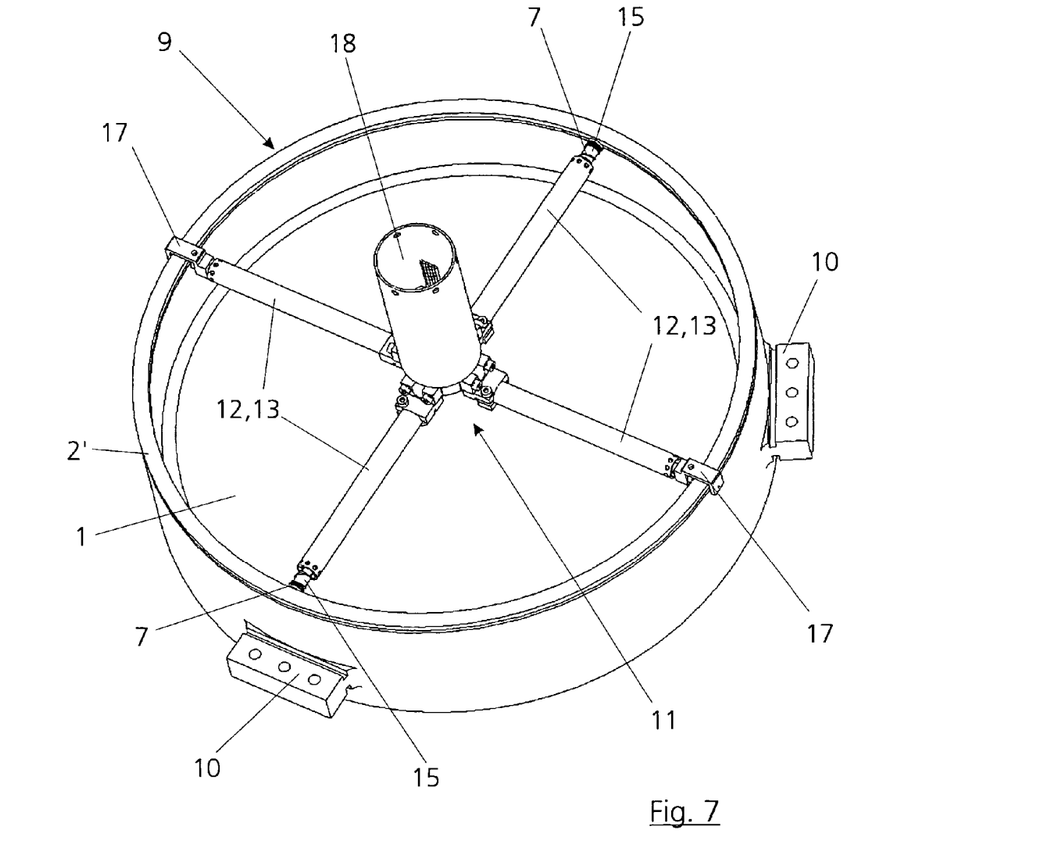
FIG. 7 shows the optical element in accordance with FIG. 4, with an apparatus for instituting a two-wave deformation, in a three-dimensional illustration.

The illustration in FIG. 6, and the three-dimensional illustration in FIG. 7 that corresponds therewith show the mirror pot 9 with an apparatus 11 for instituting a two-wave deformation in the optical element 1, that is to say an apparatus 11 for instituting an astigmatism.

The number of devices 12 that the apparatus 11 has for introducing the force into the region of the tubular extension 2' is consequently doubled by comparison with the waviness of the deformation to be instituted, each of the devices 12 in each case having at least one actuator 13 (not explicitly to be seen here). The actuators 13 arranged in the devices 12 can in this case be designed in the inherently usual manner as piezo-actuators, hydraulic or pneumatic actuators, electromechanical or electromagnetic actuators or the like. Two devices 12 are arranged on an axis 14 and have pressure elements 15 that are provided in turn with the spring element 7 in each case. The two pressure elements 15 are provided for the purpose of introducing pressure forces, which are formed predominantly perpendicular to the optical axis 3, into the extension 2' by mechanical contact with the extension 2'.

The two other devices 12 are arranged on an axis 16 aligned in the present case of the astigmatism at a fixed angle of 90° to the axis 14. The two devices 12 are each provided with pulling devices 17. In the exemplary embodiment illustrated here, the pulling devices 17 grip the tubular extension 2' owing to their hook-like design, and are therefore capable of pulling the tubular extension 2' in the direction of the optical axis 3.

The overall structure composed of the four devices 12 arranged at a fixed angle to one another can be rotated about the optical axis 3, for which purpose a drive device 18 indicated here in principle is provided. Consequently, for the case illustrated here, the two-wave, that is to say astigmatic, deformation can be instituted in the optical element 1 or the mirror pot 9 in any desired angular position in the plane perpendicular to the optical axis 3.

Basically, the design with the devices 12 can also be enlarged with regard to the number of the devices 12, for example to six devices 12, three devices arranged permanently at an angle of 120° relative to one another being required in accordance with FIG. 3b to effect an action of force in the same direction in relation to the optical axis 3. In addition to such a three-wave deformation effected by the six of the devices 12, it is also possible, however, to institute higher-wave deformations, for example four-, five- or six-wave deformations, in the mirror pot 9.

It is also possible in this case for several such apparatuses 11 to be combined with one another such that, for example, the corresponding devices 12 for instituting an astigmatism, and devices 12 corresponding in a plane parallel thereto can be arranged for the purpose of instituting a three-wave deformation. Since both apparatuses 11 can be rotated independently one against another in a particularly favorable way, this results in the possibility of instituting the two-wave or multi-wave deformations virtually approximately as desired in the mirror pot 9 by a superposition of the action of the two, or if appropriate also further apparatuses 11, without the occurrence here of an excessive outlay with regard to the actuator system required.

Of course, it also holds for the embodiments of the apparatus 11 that are described here and not illustrated explicitly that they must respectively be operated in the equilibrium of forces, that is to say in an arrangement similar to the illustration selected in FIG. 3a and FIG. 3b, in order to avoid corresponding forces being exerted on the region of the holding elements 10, which could cause further undesired deformations in the mirror pot 10, something which would not be acceptable, in particular in the case of the high precision imaging properties that are required for semiconductor lithography systems.

In addition to the way illustrated here of introducing the forces for producing the desired deformation mechanically in the tubular extension 2', the possibility also exists, of course, of introducing the forces via magnetic elements 19 such that the force can be introduced without mechanical contact, that is to say in a contactless fashion. The use of magnetic elements 19 in this case permits a direct mechanical contact to be dispensed with between the apparatus 11 and the tubular extension 2'. It is thereby possible to avoid non-reproducible conditions arising from friction or setting effects that are very difficult to master and are due to compressive loading, roughness, etc. The accuracy to be achieved, particularly with regard to the reproducibility of the institution of the desired deformations can thereby be substantially raised.

It is particularly favorable in this case to use the corresponding actuators 13 in the devices 12 to vary the spacing between two elements that are in magnetic contact or act magnetically relative to one another. Specifically, the variation in the spacing then also changes the magnetic forces, and the corresponding mating element is more strongly attracted or more strongly repulsed.

Figure 8:
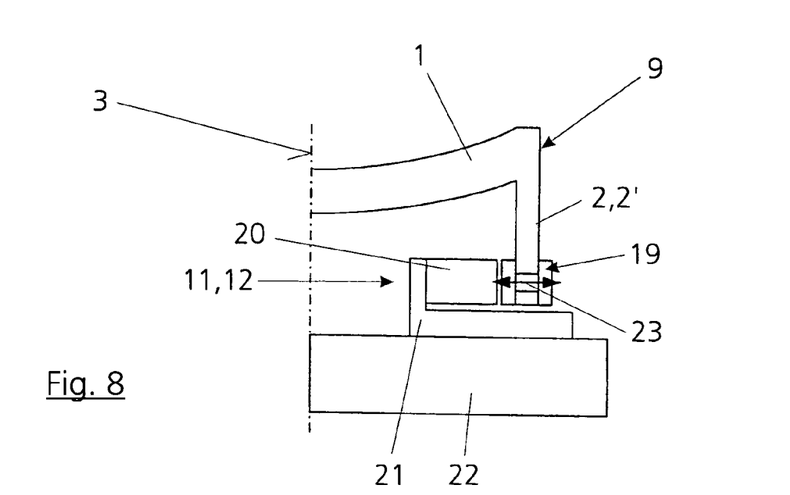
FIG. 8 shows an illustration of the principle of the possibility of actuating an electromagnetically active actuator for the purpose of instituting deformations in the optical element.

FIG. 8 shows an illustration of the principle thereof, it being possible to recognize a part of the mirror pot 9. This part of the mirror pot 9 is provided with the magnetic element 19 in the region of its tubular extension 2'. This magnetic element 19 interacts with a magnetic device 20 or an electromagnetic drive 20 that is designed in a stationary fashion relative to the magnetic element 19. In the schematic sketch illustrated here, the electromagnetic drive 20 is connected to a baseplate 22 via a holding element 21. The magnetic element 19 of the tubular extension 2' cooperates in this case in a contactless fashion with the electromagnetic drive 20. In accordance with the schematic sketch in FIG. 8, as illustrated in principle by the arrow 23, it is possible to generate forces in both directions, that is to say in the direction of the optical axis 3 and away from the optical axis, between the two electromagnetic drives.

It is therefore possible to implement several solutions for deformation by means of the electromagnetic and/or magnetic drives or elements. As already mentioned above, the simplest possibility is the variation of a spacing between two elements that are in magnetic contact or act on one another magnetically. The aim below is to go into this design in yet greater detail. However, the first aim is to illustrate the second variant solution, in the case of which the drive principle is based on the contact, likewise already mentioned, between the magnetic element 19 and an electromagnetic drive 20.

Figure 9:
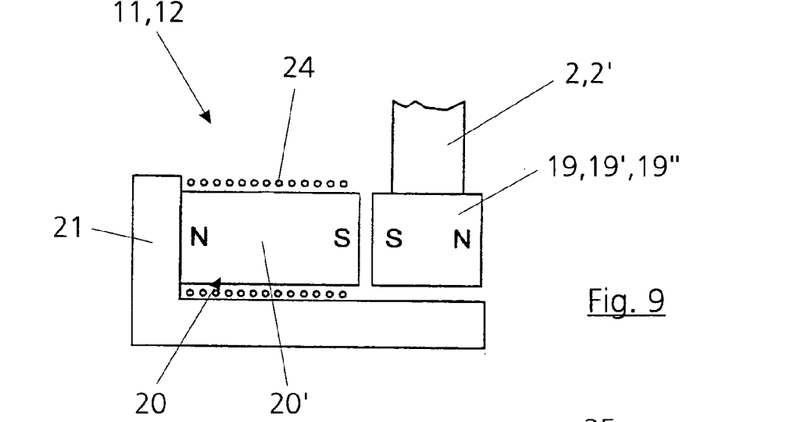
FIG. 9 shows a possible embodiment of such an electromagnetic actuator.

FIG. 9 shows a possible solution. In this case, a magnet 19' With the polarity to be seen from FIG. 9 is used as magnetic element 19 in the region of the extension 2'. As illustrated here, this magnet 19' can be connected as a discrete magnet 19' to the tubular extension 2'. However, this requires a correspondingly high number of magnets 19' and, moreover, permits only the discrete setting of the angular position for the deformation to be introduced in accordance with this number or the angular spacing between the magnets 19'.

Moreover, it is also conceivable that the magnetic element 19 is designed as a magnetic coating 19" in the region of the tubular extension 2' such that the tubular extension 2' has a continuous magnetic coating 19" at least on its side facing the optical axis 3. This permits any desired setting of the angular position for the deformation envisaged. This coating 19" is illustrated in more detail in the following FIGS.

In FIG. 9, which is illustrated here with a discrete magnet, by way of example, the magnet 19' interacts with an electromagnet 20' as electromagnetic drive device 20. The electromagnet 20', whose polarity is illustrated here to correspond to the fact that a repulsion takes place becomes between the magnetic element 19 and the electromagnetic drive devices 20, during operation can, on the one hand, have its polarity influenced via a coil 24 such that either attraction or repulsion takes place between the magnetic element 19 and the electromagnetic drive devices 20 and, on the other hand, the magnitude of the forces of attraction and repulsion of the magnetic field induced by the current flowing through the coil 24 can be varied by said current. The result of such a design of the apparatus 11 in accordance with FIG. 9 is thus a highly flexible design that permits the forces that are introduced into the tubular extension 2' of the optical element 1 to be varied approximately as desired with regard to their direction and their strength.

Moreover, during rotation of the apparatus 11 about the optical axis 3, the contactless mode of operation does not cause any sort of friction forces that could lead to corresponding deformations and stresses in the sub-μm range, as has already been indicated above, and which could have further negative influences on the imaging quality of the optical element 1 owing to the heat generated because of the friction.

Figure 10:
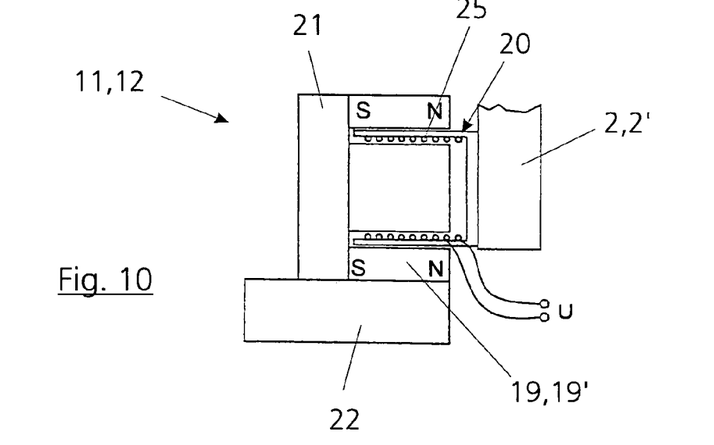
FIG. 10 shows a possible alternative embodiment of such an electromagnetic actuator.

The embodiment in accordance with FIG. 10 shows a similar design, the electromagnetic drive device 20 and the magnetic element 19 being arranged in an interchanged fashion here. This means that the electromagnetic drive device 20, which is designed here as a plunger coil 25, is arranged at the tubular extension 2'. The plunger coil 25 in this case interacts with the magnetic element 19, which is designed here in a corresponding geometric configuration such that these elements can interact with one another without any problem. Depending on the voltage U that is applied to the plunger coil 25, the desired force between the magnetic element 19 and the electromagnetic drive 20, which can be varied with regard to direction and magnitude, results in a way known per se.

This embodiment only has the disadvantage that an angular adjustment about the optical axis 3 is possible only with difficulty. Consequently, it is possible to select a design that has several discrete angular positions. This can mean, for example, that a relatively large number of plunger coils 25, for example twelve, are arranged around the circumference of the mirror pot 9 such that here, as well, it becomes possible to institute a multiwave deformation in various, but discretely prescribed, angular positions. The design in accordance with FIG. 10 with the plunger coil 25 is intended in this case for a combination with the design of the optical element 1 in accordance with FIG. 1, that is to say with individual discrete extensions 2.

Figure 11:
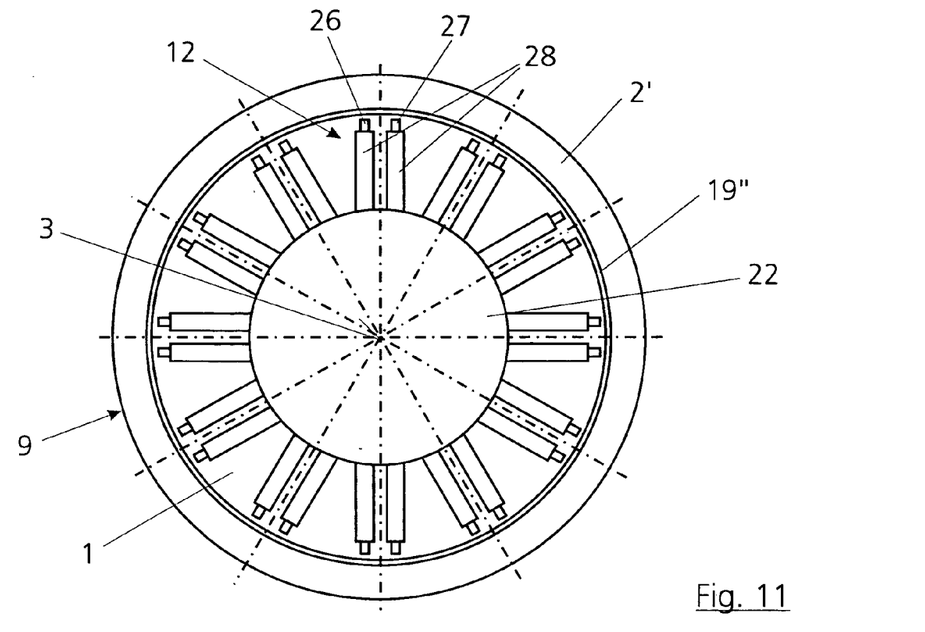
FIG. 11 shows a view of the optical element with actuators for instituting two-wave or multiwave deformations, in an alternative embodiment.

Such a design is illustrated in principle in FIG. 11, but with another actuation principle. Specifically, the design in accordance with FIG. 11 shows the mirror pot 9 in a view from its side averted from the silvered surface. In this case, twelve discrete devices 12 for introducing the force into the tubular extension 2' are to be seen in the mirror pot 9. Each of the devices 12 has here two magnets 26, 27, which are supported in each case via an actuator 28 of variable length against the baseplate 22, arranged here in the interior of the mirror pot 9. The two magnets 26, 27 are polarized such that one magnet 26 can ensure repulsion between itself and the magnetic element 19, which is designed here as a magnetic coating or layer 19". The spacing between the respective magnet 26, 27 and the magnetic layer 19" can be varied by the respective actuator 28. Depending on the spacing, the magnetic layer 19", and thus the tubular extension 2' connected to it, is more strongly or more weakly attracted or repulsed by the magnets 26, 27.

As already mentioned above, a number of individual magnets 19' can also be integrated in the tubular extension 2' instead of in the magnetic layer 19", as a result of which only discrete angular positions can again be taken into account when instituting the deformation. The rotation, also basically possible in the case of the design in accordance with FIG. 11, of the structure of baseplate 22 and devices 12 could therefore be dispensed with, if appropriate. It is true that the above-named variation with regard to the angle is thereby partially lost, but for appropriate applications, a variation of the angle in twelve different positions can be sufficient, and the design can thereby gain in stability.

The magnetic layer 19" can in this case consist of an inherently magnetic material, that is to say it can be a type of permanent magnet that is vapor deposited or sputtered on. However, it would also suffice as an alternative to this to have a layer 19" that, is made from a magnetic material, for example iron or the like, and cooperates with the magnets 26, 27 designed, for example, as permanent magnets.

Figure 12:
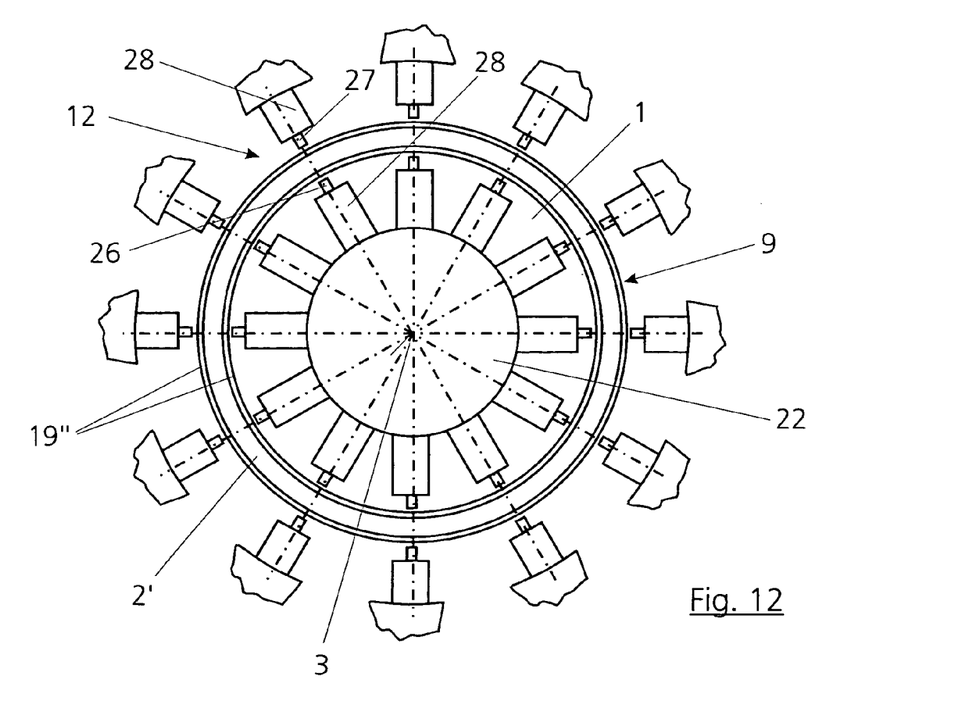
FIG. 12 shows a view of the optical element with actuators for instituting two-wave or multiwave deformations in a further alternative embodiment.

FIG. 12 shows a comparable design, the tubular extension 2' being provided here with the magnetic layer 19" both on its side facing the optical axis 3 and on its side averted from the optical axis 3. In each case, only one of the actuators 28, which carries one magnet 26, is then arranged on the side of the tubular extension 2' facing the optical axis 3. The magnet 27 is arranged with the second actuator 28 on the side of the tubular extension 2' averted from the optical axis 3.

The possibility of varying the deformation to be instituted is comparable here, but corresponding advantages can arise with regard to the structural configuration.

Of course, it is also possible in principle for all the embodiments illustrated here to be combined with one another, in particular it is also conceivable to arrange the devices 12 with their design in accordance with FIG. 11 only on the side of the tubular extension 2' averted from the optical axis 3, such that the optical element 1 can also be designed as a transparent optical element 1, for example as a lens.

For all the configurations of the devices 12, except for the plunger coil 25, it is then possible in this case for the rotation about the optical axis 3 to be appropriate in a plane perpendicular to this optical axis 3, its possibility of variation being, in turn, capable of restriction by integrating discrete magnets or the like. However, this can be of secondary importance given an appropriately high number of discrete magnets and/or stationary devices 12.

The result is an optical element 1 that can be influenced very effectively with regard to astigmatism and higher-wave, in particular three-wave deformations and that has a simple, reliable and compact design which can be integrated in an imaging system, for example in a lens for semiconductor lithography, without any problem with regard to its space requirement and its drive capability.

Actuators that are known in essence can be used to introduce the forces in the case of all arrangements, that is to say both the actuator 4 in accordance with the illustration in FIG. 2, and the actuators 13 of FIGS. 6 and 7, which are integrated in the respective devices 12, as well as the actuators 28 of FIGS. 11 and 12. In this case, the use of spring forces, pneumatic cylinders or hydraulic cylinders is just as conceivable for actuating the actuators 4, 13, 28 as the particularly favorable and advantageous application of piezoelectric elements, in particular as piezoelectric stacks. Further favorable properties arise from the use of magnetic or electromagnetically active devices 12. The electromagnetic design means that the forces can be introduced and switched in very uniformly such that no additional dislocations or deformations of the design come about owing to the support of the reaction forces, since all the forces that cancel one another out again in total can be applied uniformly and simultaneously. Moreover, the combination of the institution of several different wavinesses that, as already named above in FIGS. 6 and 7, is always possible in principle, is substantially simplified in the case of the electromagnetic apparatuses 11, since no additional elements are required, for example in the case of designs with discrete angular positions in accordance with FIG. 11 or 12. All the electromagnetic drive elements can in this case impress both tensile forces and compressive forces on the optical element 1, only the polarity of the magnets and/or the institution of the corresponding direction of voltage and/or current being decisive in this case.

Since, in particular when the optical element 1 is a mirror, the desired deformations to be instituted are very small and lie only in the sub-μm range or nanometer range, it is possible to use miniaturized electromagnetic drives for this purpose. In addition to the structural advantages, this leads to a smaller power consumption with a correspondingly reduced evolution of heat. The heat nevertheless occurring can be dissipated, for example, by means of direct water cooling or the like. This dissipation of the heat can be integrated in the baseplate 22, for example.

The preferred purpose of use for an apparatus 11 such as has been described here is to be found in the field of optical elements 1 that are used for imaging devices in projection exposure machines in microlithography.

What is claimed is:

1. A deformation apparatus for instituting a two-wave or multi-wave deformation in an optical element with an optical axis, in an exposure lens in semiconductor lithography, wherein the optical element comprises at least one extension in the direction of the optical axis, wherein at least one device for introducing a force into the extension is arranged in the region of each of the extensions or of the extension; and further including a magnetic device of electro magnetic design that interacts in a contactless fashion with at least one magnetic element in the region of the extension to apply said force by influencing the magnetic strength, said magnetic device comprising at least one plunger coil affixed to the extension.

2. The deformation apparatus as claimed in claim 1, wherein the sum of said introduced forces vanishes.

3. The deformation apparatus as claimed in claim 1, wherein the optical element is a mirror.

4. The deformation apparatus as claimed in claim 1, wherein said at least one extension is designed as at least approximately tubular extension.

5. The deformation apparatus as claimed in claim 4, wherein said tubular extension is of unipartite design with said optical element.

6. The deformation apparatus as claimed in claim 4, wherein the said tubular extension is designed as a cylindrical tube section.

7. The deformation apparatus as claimed in claim 4, wherein said tubular extension is designed as a frustoconical tube section.

8. The deformation apparatus as claimed in claim 1, wherein a number of devices for introducing said force, which number is doubled by comparison with the waviness of the deformation to be instituted, are arranged in the region of each of said extensions or of said extension.

9. An exposure lens in semiconductor lithography with a deformation apparatus for instituting a two-wave or multi-wave deformation in an optical element with an optical axis, wherein the optical element comprises at least one extension in the direction of the optical axis and wherein at least one device for introducing a force into the extension is arranged in the region of the extension, wherein said at least one device for introducing said force has at least one actuator, which has a direct or indirect mechanical contact with said extension, at least in the case of the introduction of the force, said force pressing said extension away from said optical axis or drawing it toward the optical axis and capable of being impressed on said extension by an actuator and said actuator comprises at least one magnetic device which comprises at least one plunger coil permanently connected to the extension.

10. The exposure lens as claimed in claim 9, wherein the sum of said introduced forces vanishes.

11. The exposure lens as claimed in claim 9, wherein at least one magnetic element or the magnetic device are of electromagnetic design, wherein the applied force is varied by influencing the magnetic strength.

12. The exposure lens as claimed in claim 9, wherein the optical element is a mirror.

13. The exposure lens as claimed in claim 9, wherein said at least one extension is at least an approximately tubular extension.

14. The exposure lens as claimed in claim 13, wherein said tubular extension is integral with said optical element.

15. The exposure lens as claimed in claim 13, wherein the said tubular extension is a cylindrical tube section.

16. The exposure lens as claimed in claim 13, wherein said tublular extension is a frustoconical tube section.

17. A deformation apparatus for instituting a two-wave or multi-wave deformation in an optical element with an optical axis, in an exposure lens in semiconductor lithography, wherein the optical element comprises at least one extension in the direction of the optical axis, wherein at least one device for introducing a force into the extension is arranged in the region of each of the extensions or of the extension; wherein said at least one device for introducing said force further includes at least one actuator, which has a direct or indirect mechanical contact with said extension at least in the case of the introduction of the force and further including a magnetic device of electro magnetic design that interacts in a contactless fashion with at least one magnetic element in the region of the extension to apply said force by influencing the magnetic strength, said magnetic device comprising at least one plunger coil affixed to the extension.

18. The deformation apparatus as claimed in claim 17, wherein the sum of said introduced forces vanishes.

19. The deformation apparatus as claimed in claim 17, wherein a spacing between said magnetic device and said at least one magnetic element can be varied by means of said actuator in order to influence said introduced force.

20. The deformation apparatus as claimed in claim 17, wherein said at least one device for introducing said force is rotatable arranged about the optical axis particularly when used together with a tubular extension.

21. The deformation apparatus as claimed in claim 17, wherein the optical element is a mirror.

22. The deformation apparatus as claimed in claim 17, wherein said at least one extension is designed as at least approximately tubular extension.

23. The deformation apparatus as claimed in claim 22, wherein said tubular extension is of unipartite design with said optical element.

24. The deformation apparatus as claimed in claim 22, wherein the said tubular extension is designed as a cylindrical tube section.

25. The deformation apparatus as claimed in claim 22, wherein said tubular extension is designed as a frustoconical tube section.

26. A deformation apparatus for instituting a two-wave or multi-wave deformation in an optical element with an optical axis, in an exposure lens in semiconductor lithography, wherein the optical element comprises at least one extension in the direction of the optical axis, wherein at least one device for introducing a force into the extension is arranged in the region of each of the extensions or of the extension; and further including a magnetic device of electro magnetic design that interacts in a contactless fashion with at least one magnetic element in the region of the extension to apply said force by influencing the magnetic strength, said magnetic device comprising at least one plunger coil affixed to the extension wherein a force that presses said extension away from said optical axis or draws it toward the optical axis can be impressed on said extension by an actuator.

27. The deformation apparatus as claimed in claim 26, wherein the sum of said introduced forces vanishes.

* * * * *

UNITED STATES PATENT AND TRADEMARK OFFICE
CERTIFICATE OF CORRECTION

PATENT NO. : 7,295,331 B2  Page 1 of 1
APPLICATION NO. : 10/489030
DATED : November 13, 2007
INVENTOR(S) : Thomas Petasch, Hartmut Muenker and Bernhard Gellrich It is certified that error appears in the above-identified patent and that said Letters Patent is hereby corrected as shown below:

Column 2, Line 32
Please delete "of thee optical ..." and insert --... of the optical ...--

Column 7, Line 15
Please delete "...magnet 19' With the ..." and insert --magnet 19' with the ...--

Column 8, Line 51
Please delete "....layer 19" that, is" and insert --...layer 19" that is ...--

Signed and Sealed this

Twenty-fourth Day of June, 2008

JON W. DUDAS
*Director of the United States Patent and Trademark Office*

UNITED STATES PATENT AND TRADEMARK OFFICE
CERTIFICATE OF CORRECTION

PATENT NO. : 7,295,331 B2
APPLICATION NO. : 10/489030
DATED : November 13, 2007
INVENTOR(S) : Thomas Petasch, Hartmut Muenker and Bernhard Gellrich It is certified that error appears in the above-identified patent and that said Letters Patent is hereby corrected as shown below:

TITLE PG, ITEM (73) ASSIGNEE:

Please delete "Carl Zeiss Smt Ag" and insert --Carl Zeiss SMT AG--.

Signed and Sealed this

Thirtieth Day of September, 2008

JON W. DUDAS
*Director of the United States Patent and Trademark Office*